United States Patent [19]
Kersh, III et al.

[11] Patent Number: 5,475,640
[45] Date of Patent: * Dec. 12, 1995

[54] METHOD AND APPARATUS FOR INHIBITING A PREDECODER WHEN SELECTING A REDUNDANT ROW LINE

[75] Inventors: David V. Kersh, III, Houston; Roger D. Norwood, Sugarland, both of Tex.

[73] Assignee: Texas Instruments Incorporated, Dallas, Tex.

[*] Notice: The portion of the term of this patent subsequent to Jul. 5, 2011, has been disclaimed.

[21] Appl. No.: 215,554

[22] Filed: Mar. 21, 1994

Related U.S. Application Data

[63] Continuation of Ser. No. 653,855, Feb. 8, 1991, Pat. No. 5,327,380, which is a continuation of Ser. No. 265,105, Oct. 31, 1988, abandoned.

[51] Int. Cl.⁶ .................................................. G11C 8/00
[52] U.S. Cl. .................. 365/200; 365/189.05; 365/195; 365/230.03; 365/230.06; 371/10.3
[58] Field of Search .................. 365/200, 230.06, 365/195, 189.05, 230.03; 371/10.3

[56] References Cited

U.S. PATENT DOCUMENTS

| | | | |
|---|---|---|---|
| 4,546,455 | 10/1985 | Iwahashi et al. | 365/200 |
| 4,757,474 | 7/1988 | Fukushi et al. | 365/230.03 |
| 4,791,615 | 12/1988 | Pelly et al. | 365/200 |

*Primary Examiner*—Joseph E. Clawson, Jr.
*Attorney, Agent, or Firm*—Ronald O. Nerrings; James C. Kesterson; Richard L. Donaldson

[57] ABSTRACT

A circuit is provided for replacing a defective signal path (94) of a plurality of like signal paths with a redundant signal path (95, 96). A redundant decoder (72) is programmable to respond to a plurality of predetermined addressing signals (RFn) that normally operate to address the defective signal path (94, ROWL1R and ROWL1L). The redundant decoder is operable to generate a disable signal (RREN) in response to the predetermined addressing signals (RFn) and also is operable to select a redundant signal path (95, 96) in response thereto. A decoding circuit (70, 74) normally decodes selected ones of a plurality of addressing signals (RFn) and selects at least one of a plurality of signal paths in response thereto. The decoding circuit (70, 74) is coupled to the redundant decoder (72) for receiving the disable signal (RREN) therefrom. In response to receiving this disable signal (RREN) the decoding circuit (70, 74) will not decode the preselected addressing signals (RFn).

17 Claims, 6 Drawing Sheets

METHOD AND APPARATUS FOR INHIBITING A PREDECODER WHEN SELECTING A REDUNDANT ROW LINE

This is a continuation of application Ser. No. 07/653,855, filed Feb. 8, 1991 U.S. Pat. No. 5,327,380 which is a continuation of Ser. No. 07/265,105, filed Oct. 31, 1988, now abandoned.

TECHNICAL FIELD OF THE INVENTION

The present invention relates in general to the selection of redundant row lines, and more particularly relates to a method and apparatus for deselecting a defective row line and selecting a redundant row line using a programmable redundant row redundant decoder.

BACKGROUND OF THE INVENTION

New and different types of DRAM array architecture as well as tighter design specifications for integrated circuit chip size require new designs for implementing redundant row lines and the circuits for enabling them. The provision of redundant row lines allows faulty word lines to be replaced in order to repair the DRAM to a sellable status.

One conventional row redundancy method is to blow a fuse between a bad word line and its respective decoder circuit, thus disabling the faulty word line. Fuses are also blown in a redundant decoder in order to program the redundant decoder to connect a redundant word line to a global drive/boot signal line when the redundant address is selected. This replaces the bad word line or row line with a redundant word line. A disadvantage of this conventional method is that each word line must have a fuse located between it and its row decoder. This can take up large amounts of space and may not even be possible to implement on chips with small row pitches. This method is however efficient since only the bad word line is replaced and not several other good word lines along with it.

Other conventional methods of enabling redundant row lines and disabling faulty word lines will be discussed below, but may be briefly reviewed here. In order to program a redundant row line according to another method, a fuse is blown in the normal decoder to disable it and all word lines connected to it. Fuses are then blown in a redundant decoder to program it to replace the decoder and its bad word line. Although only one fuse is needed for every four word lines, this method is relatively inefficient in replacing bad word lines since one bad word line will cause three other good word lines to be replaced in addition to itself.

A third conventional method is to blow fuses in a redundant decoder in order to program it to the address of the bad word line. Then, once this redundant decoder detects the redundant address, it completely disables a global drive/boot signal generator that would drive the bad word line through a decoder, and enables a redundant drive/boot generator which then drives a redundant word line through the redundant decoder. Therefore, the replaced word line does not become active since the normal drive/boot generator is disabled for this cycle. Although this method does not need a fuse for each word line or even for each row decoder, it is disadvantageous in that a separate redundant drive/boot generator is required in the peripheral area of the chip. In view of the drawbacks of each of these conventional methods, a need has arisen for a redundancy scheme that will have the capability of replacing a single word line but nonetheless does not require a fuse for each row or an additional drive/boot signal generator.

SUMMARY OF THE INVENTION

One aspect of the invention comprises a circuit for replacing a defective signal path of a plurality of like signal paths with a redundant signal path. The circuit comprises a redundant decoder programmable for responding to a plurality of predetermined addressing signals corresponding to the defective signal path. The decoder is operable to generate a disable signal and to select a redundant signal path in response to the predetermined addressing signals. A decoding circuit for decoding selected ones of a plurality of addressing signals and selecting at least one of a plurality of signal paths in response thereto is provided, and is coupled to the redundant decoder for receiving the disable signal. The decoding circuit will fail to decode the predetermined addressing signals in response to receiving the disable signal.

In another aspect of the invention, the decoding circuit includes a predecoder and a bank of decoders. The bank of decoders are coupled to the predecoder with a plurality of predecoder lines. The predecoder is coupled to the redundant decoder by the disable signal, and becomes disabled by being blocked from selecting one of the predecoder lines in connecting a global signal source to the decoders.

In a further aspect of the invention, the redundant decoder comprises a plurality of addressing transistors. Each of the transistors is operable by receipt of a respective addressing signal to couple a node to a supply of a first voltage. Each addressing transistor is coupled to the node through an isolation device. The redundant decoder is programmed by causing selected ones of the isolation devices to isolate respective transistors from the node. Then, when a set of addressing signals is received by the redundancy decoder which corresponds to the defective signal path, the addressing transistors will be unable to couple the node to the supply of the first voltage. The node therefore remains at a second voltage, which causes circuitry coupled to it to both generate the disable signal and to connect a redundant row line to the global signal source.

One advantage of the invention is that the use of fuses for each word line or row decoder is avoided. Only one global signal source such as a drive/boot signal generator need be provided. The present invention nevertheless allows the replacement of a single bad word line with a single redundant word line, thereby having optimum redundancy efficiency. In a preferred embodiment, each redundant decoder is capable of replacing two defective word lines with two redundant word lines.

BRIEF DESCRIPTION OF THE DRAWINGS

Other aspects of the invention and their advantages will be discerned by referring to the following detailed description when read in conjunction with the drawings, in which.

DETAILED DESCRIPTION OF THE INVENTION

Figure 1:
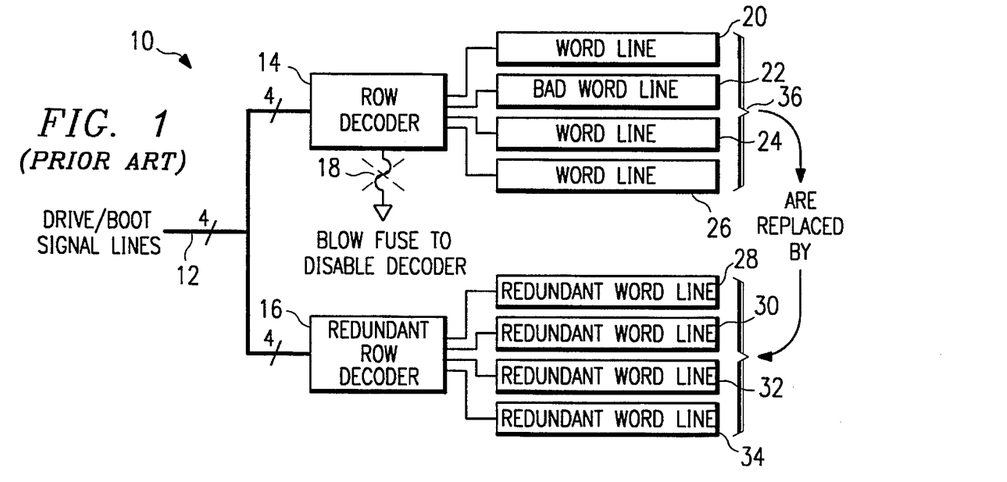
FIG. 1 is a schematic block diagram of a conventional row redundancy scheme.

FIG. 1 illustrates one prior art redundancy circuit indicated generally at 10. A plurality of drive/boot signal lines 12 are connected to a drive/boot signal generator located in a periphery of a DRAM array (not shown) and are further connected to a row decoder 14 and a redundant row decoder 16. Row decoder 14 and redundant row decoder 16 are repeated many times within the cell array area. Each row decoder 14 has a fuse 18 for disabling its operation. A plurality of row or word lines 20, 22, 24 and 26 are connected to the row decoder 14. A plurality of redundant word lines 28, 30, 32 and 34 are connected to the redundant row decoder 16.

When a bad word line such as word line 22 is discovered, the fuse 18 of the row decoder 14 is blown, and further fuses (not shown) within the redundant row decoder 16 are blown to program it to receive a particular set of addressing signals (not shown). The result is to replace an entire section 36 of the word lines 20-26 with redundant word lines 28, 30, 32 and 34. As can be seen, this redundancy scheme is markedly inefficient, as three normal word lines 20, 24 and 26 are replaced along with the one defective word line.

Figure 2:
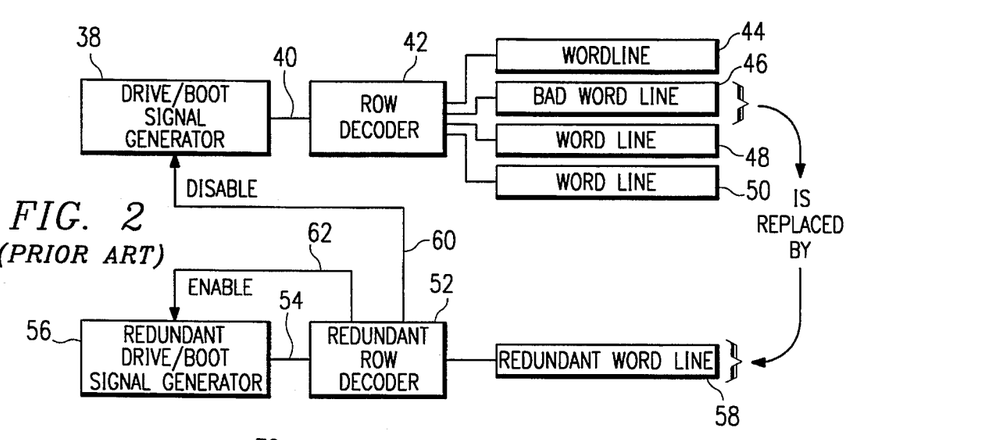
FIG. 2 is a schematic block diagram of a second conventional row redundancy scheme.

FIG. 2 is a schematic block diagram illustrating another conventional redundancy scheme. A single drive/boot generator 38 is connected by a drive/boot generator signal line 40 to one of a plurality of row decoders 42 (one shown). Each row decoder 42 is in turn connected to four word lines 44, 46, 48 and 50. A redundant row decoder 52 is provided for a pluality of row decoders 42 (one shown). A redundant drive/boot signal generator line 54 connects each of the redundant row decoders 52 to a redundant drive/boot signal generator 56. The redundant row decoder 52 is further connected to a redundant word line 58. A disable line 60 connects each of the redundant row decoders 52 to the drive/boot signal generator 38, while an enable line 62 couples each of the redundant row decoders 52 to the redundant drive/boot signal generator 56.

In the operation of this conventional redundancy scheme, fuses (not shown) are blown in the redundant row decoder 52 in order to program it to the address of a bad word line 46. Once the redundant decoder 52 detects the redundant address by the receipt of a set of addressing signals on a plurality of addressing signal lines (not shown), it will completely disable the standard drive/boot signal generator 38 and will enable the redundant drive/boot signal generator 56. A drive/boot signal therefore does not get transmitted through line 40, decoder 42 and to the bad word line 46. Instead, a redundant drive/boot signal is transmitted along line 54 through the redundant row decoder 52 and out to the redundant word line 58. While this second scheme replaces a single bad word line 46 with a redundant word line 58, it also requires a set of global disable and enable lines 60 and 62 and an extra drive/boot signal generator 56 which is used only for row redundancy.

Figure 3:
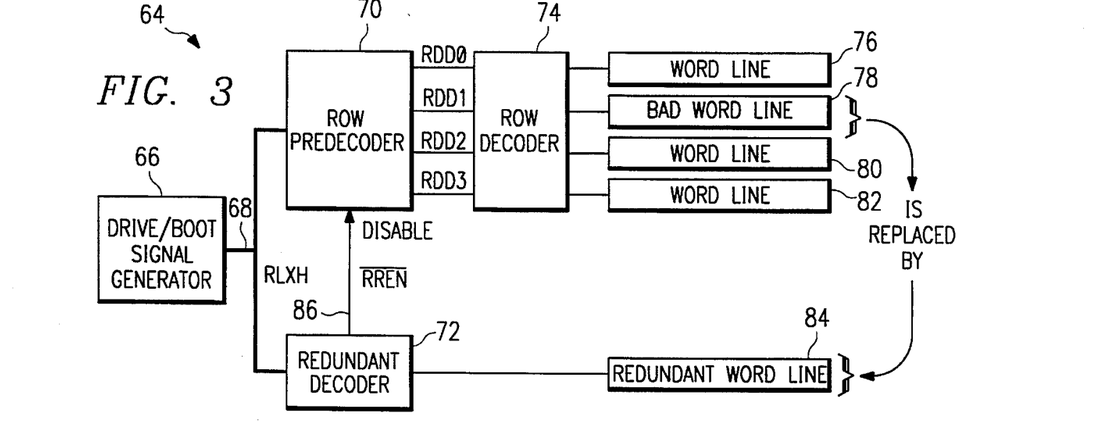
FIG. 3 is a schematic electrical block diagram of row redundancy circuitry according to the invention.

A schematic block diagram of a redundancy circuit according to the invention is shown in FIG. 3, and is indicated generally at 64. A single drive/boot signal generator 66 is coupled by a single RLXH line 68 to each of a plurality of row predecoders 70 (one shown) and a like plurality of redundant decoders 72 (one shown) within the array. Each row predecoder 70 is further connected to a respective plurality of row decoders 74 (one shown) by a plurality of row predecoder lines RDD0–RDD3. Each row decoder 74 is connected to a respective plurality of word lines 76, 78, 80 and 82. The redundant decoder 72 is connected to one or more redundant word lines 84 (one shown). A disable signal line 86 is operable to carry a disable signal $\overline{\text{RREN}}$ from the redundant decoder 72 to a respective particular row predecoder 70.

Figure 6:
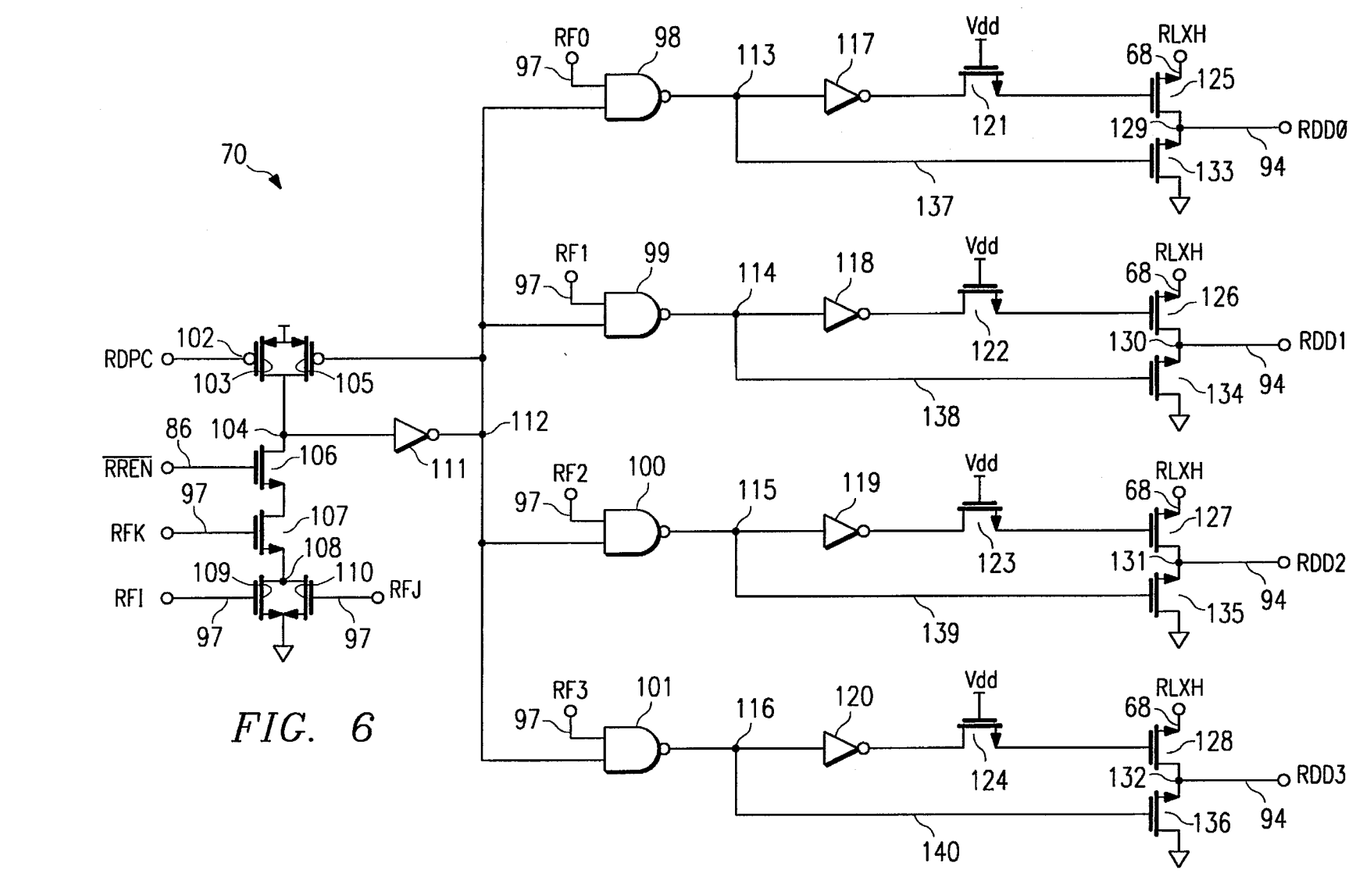
FIG. 6 is a schematic electrical circuit diagram of a predecoder that may be used in conjunction with the invention.
Figure 7:
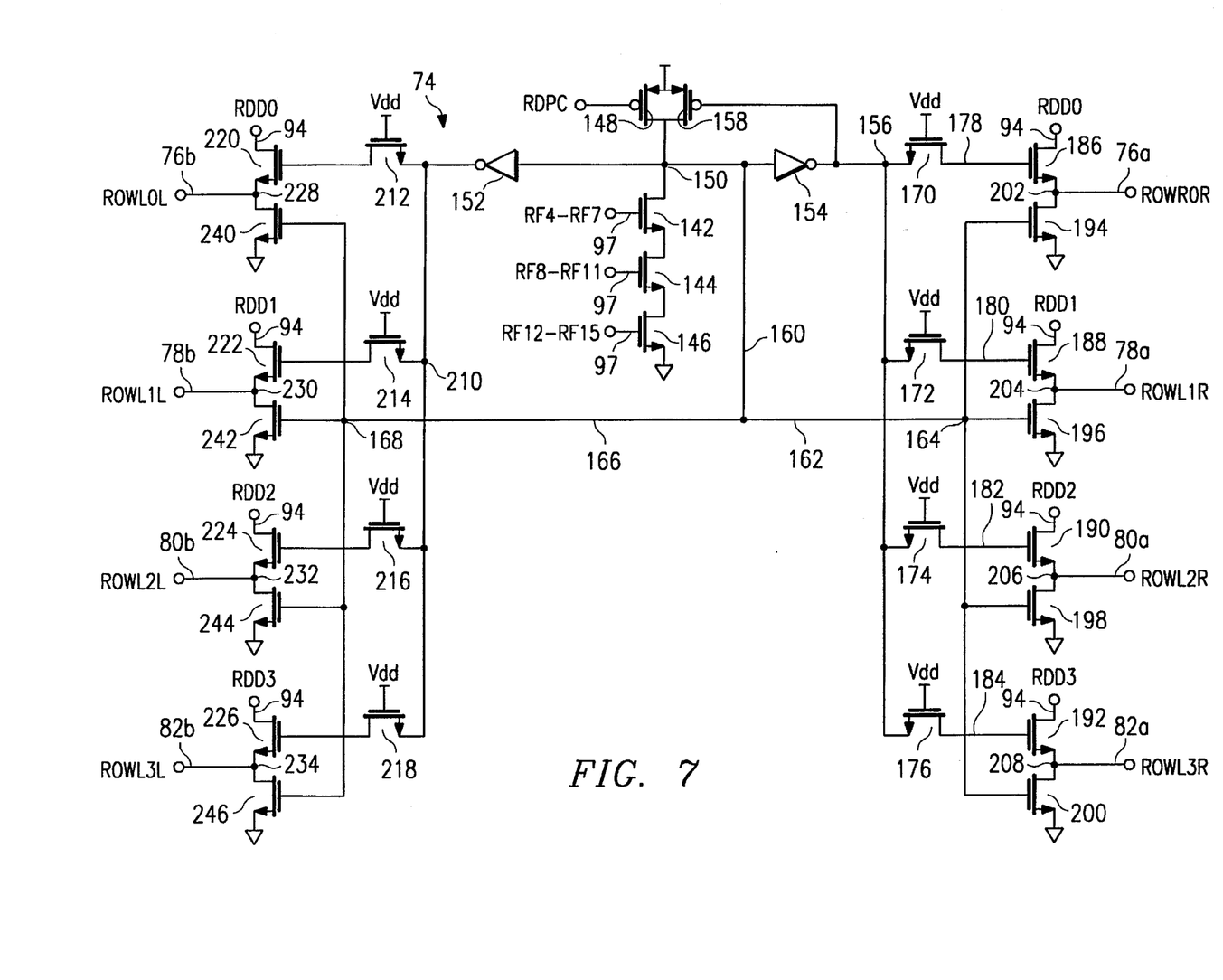
FIG. 7 is a schematic electrical diagram of a decoder circuit that may be used in conjunction with the invention.
Figure 8:
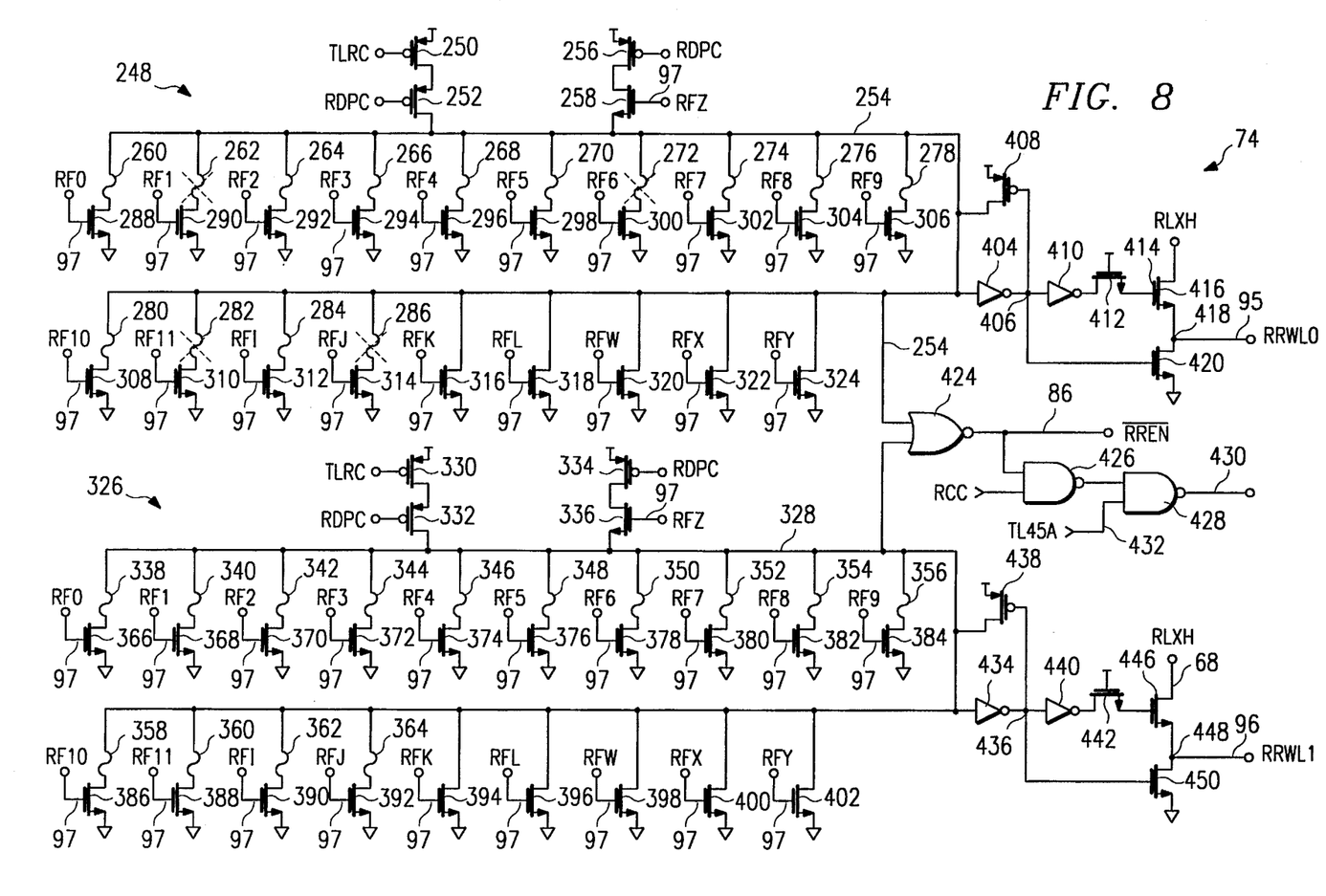
FIG. 8 is a detailed schematic electrical diagram of a redundant decoder according to the invention that is used in conjunction with the predecoder circuit shown in FIG. 6 and the decoder circuit shown in FIG. 7.

As will be more particularly explained in conjunction with FIGS. 6, 7 and 8, each redundant decoder 72 is capable of receiving a plurality of addressing signals (not shown in FIG. 3). The row predecoder 70 and row decoder 74 together constitute a decoding circuit that also receives these same addressing signals. The addressing signals normally operate to select one row predecoder within a quadrant on the chip (see FIG. 4), one of a plurality of row decoders 74 within each decoder bank, and one of the four word lines 76–82 connected to each row decoder.

When a bad word line such as word line 78 is discovered, fuses (see FIG. 8), switches or other isolation devices can be blown or programmed within the redundant decoder 72 such that the redundant decoder 72 will recognize the set of addressing signals corresponding to the bad word line 78. In response to this set of addressing signals, the redundant decoder 72 will generate a disable signal on line 86, thereby disabling the predecoder 70 from selecting one of the predecoder lines RDD0–RDD3. This same recognition of the set of addressing signals actuates the redundant decoder 72 to connect a redundant word line 84 to the RLXH line 68, thereby completing a redundant signal path in replace of a path including the bad word line 78.

Figure 4:
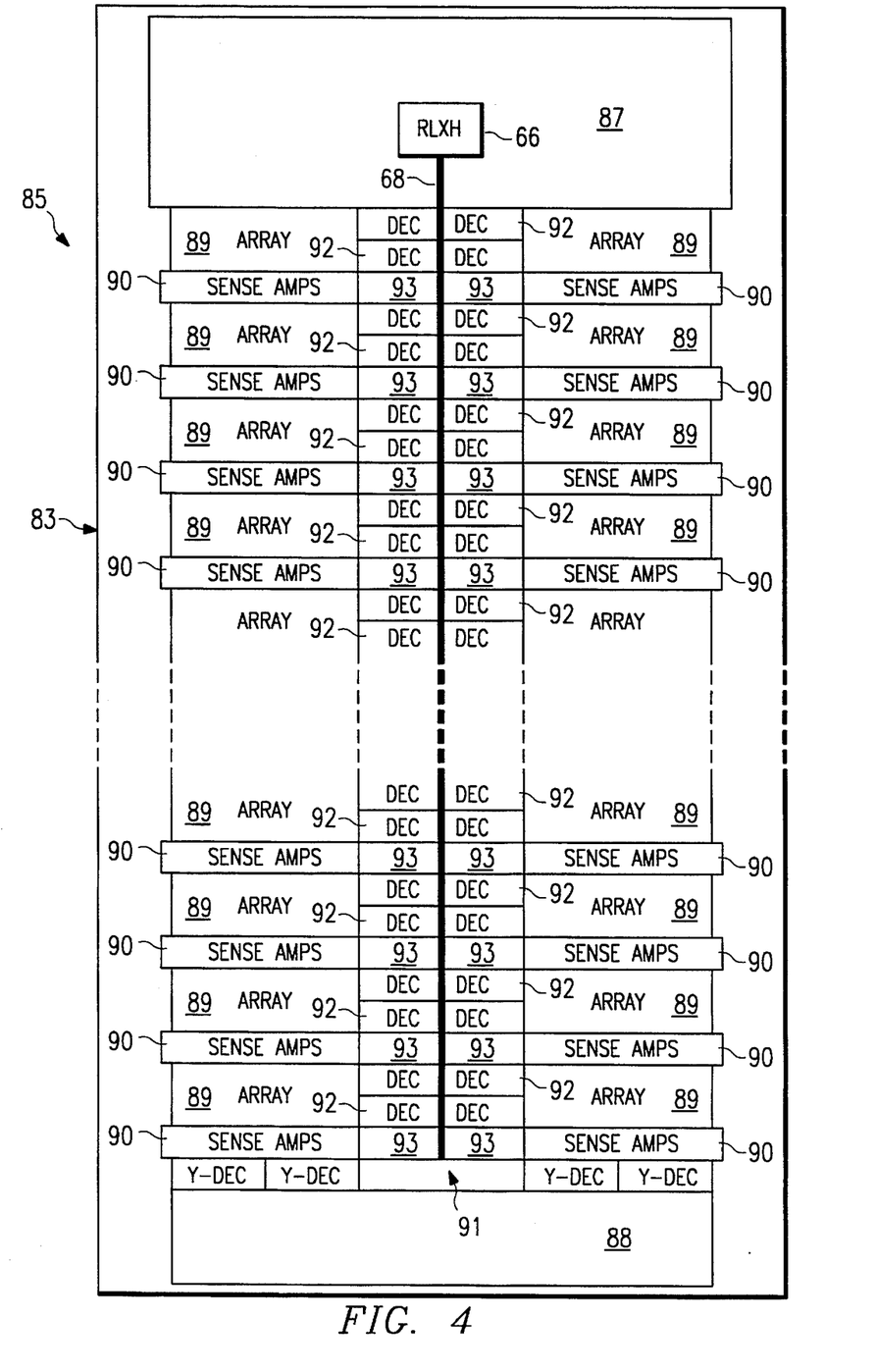
FIG. 4 is a schematic plan view of a layout of a dynamic random access memory (DRAM) chip.

Referring now to FIG. 4, a layout of a dynamic random access memory (DRAM) chip is shown generally at 85. Throughout FIGS. 3–8, like characters identify like structure where possible. The particular layout shown is for a four megabit DRAM. The chip 85 includes a cell array area indicated generally at 83, and a pair of end peripheral areas 87 and 88 within the cell array area 83.

In the illustrated embodiment, a row factor signal generator (not shown) and a drive/boot signal generator 66 (RLXH) are formed in the peripheral area 87. The size and positioning of the signal generator 66 is shown only schematically. The drive/boot signal generator 66 has an output connected to a drive/boot signal generator line 68 that runs down the middle of the array area 83. The row factor signal generator (not shown) has a plurality of row factor signal lines (not shown) that also run down the middle of the array area 83 so as to be substantially parallel to the drive/boot signal line 68.

The array area 83 contains a plurality of DRAM memory cell arrays 89 that are arranged in rows and columns. In the embodiment illustrated, there are thirty-two arrays 89 arranged in sixteen rows and two columns, each array having 128K memory cells. Only the first five and the last four of the rows are shown, the remaining seven middle rows being similar in construction and indicated by dashed continuation lines. The arrays are spaced from each other in a vertical or columnar direction by respective ones of a plurality of sense amplifiers 90 and in a row or horizontal direction by a vertical space indicated generally at 91.

The vertical space 91 is in part occupied by a plurality of row decoder sections 92. The layout of the arrays 89, sense amplifiers 90 and row decoder banks 92 leaves a plurality of "holes" 93 that are used to lay out the predecoders and row redundancy decoders described below. The drive/boot signal line 68 and the row factor signal lines (not shown) are preferably routed down the length of the chip within the vertical space 91.

Figure 5:
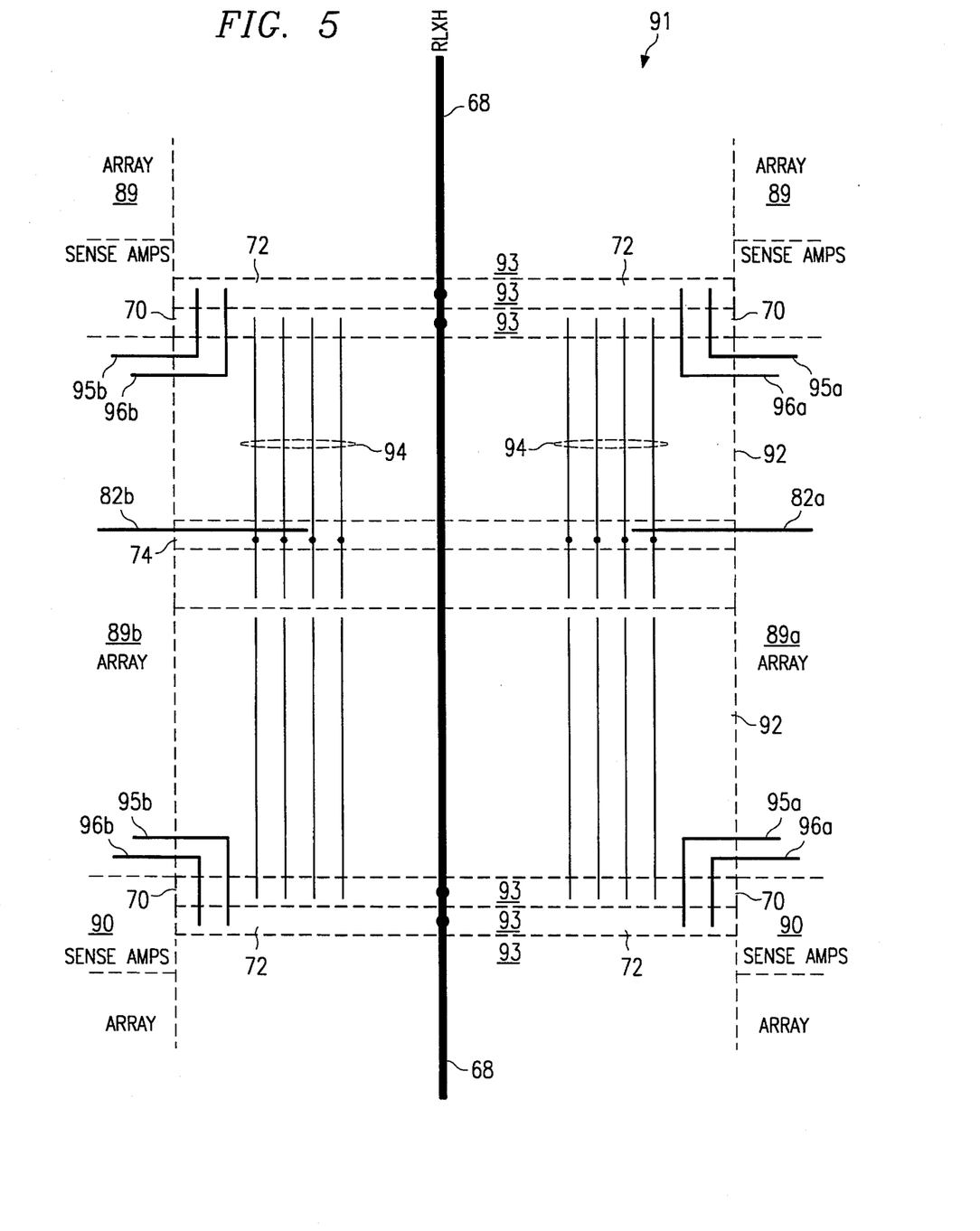
FIG. 5 is a magnified schematic plan view of a portion of FIG. 4.

Turning now to FIG. 5, a small detail of the layout shown in FIG. 4 is illustrated. The areas devoted to laying out cell arrays 89, sense amplifiers 90, decoder banks 92, predecoders 70 and row redundancy decoders 72 are indicated by dashed lines. The row decoder banks 92 are preferably laid out to extend across the vertical space 91 from one cell array 89a in the right column to the opposite cell array 89b in the left column. In the illustrated embodiment, there are thirty-two row decoders 74 in each row decoder bank 92, one such row decoder being indicated at 74 surrounded by a dashed enclosure. Each row decoder 74 is operable to decode the drive/boot signal line RLXH onto two of eight word or row lines, four of the row lines being disposed in the cell array 89a and the other four row lines being disposed in the cell array 89b. Two of these word lines are shown at 82a, 82b.

A predecoder 70 is preferably laid out to be adjacent a respective decoder bank 92. Predecoders 70 are laid out to use at least some of the space provided by "holes" 93. Each decoder bank 92 is further provided with a row redundancy decoder 72 that is preferably disposed in an area adjacent to a respective predecoder 70 within a "hole" 93.

The drive/boot signal (RLXH) generator line 68 is constituted by a relatively wide conductor strap in second metal to minimize resistance and preferably runs down the middle of the vertical space 91. RLXH line 68 is connected to each row redundancy decoder 72 and each predecoder 70 along the length of the chip, as shown schematically by the connection dots on line 68.

Each of twenty row factor signal lines run generally in parallel with RLXH line 68 (not shown) are connected to each row redundancy decoder 72, but only selected ones of these row factor signal lines are connected to any one of the predecoders 70 and the decoders 74. The row factor signal lines are connected to a particular predecoder 70 or to a particular decoder 74 according to a decoding scheme described more particularly in conjunction with FIGS. 6 and 7.

A plurality of predecoder lines 94 originate within the predecoder 70 and are disposed generally in parallel with the RLXH signal line 68. Each pair of lines 94 illustrated in FIG. 5 is actually one node, as shown in FIG. 6. One line of the pair is on the left hand side of the RLXH line 68, while the other line of the pair is on the right side. The predecoder lines 94 are preferably formed in second metal where they are parallel to the row factor lines (not shown), and in first metal when they run perpendicular thereto (not shown in this schematic representation). Each predecoder line 94 per bank 92 intersects and is connected with each decoder 74 in a respective decoder bank 92. In the illustrated embodiment, there are four predecoder output nodes 94 per bank 92 and the signals carried thereon are termed RDD0, RDD1, RDD2 and RDD3 (see FIGS. 3, 6 and 7), with each of these signals being carried on two of the eight lines per bank 92.

In the illustrated embodiment, each row redundancy decoder 72 is programmable to decode the drive/boot signal RLXH onto a selected two of four redundant row lines 95a, 95b, 96a and 96b. The redundant row lines 95a, b and 96a, b connect to respective rows of memory cells (not shown). Four redundant row lines 95a, 95b and 96a, 96b are provided to replace up to two pairs of regular row lines 82a, 82b as needed.

Turning now to FIG. 6, there is illustrated a detailed electrical schematic diagram of one of the predecoders 70. A plurality of selected row factor lines 97 are connected as inputs to the predecoder circuit 70. Row factor lines RF0–RF3 are connected to respective inputs of four NAND gates 98–101. Row factor signal lines RF0–RF3 are connected to each predecoder circuit 70 on the chip. On the other hand, the identity of three other row factor signal input lines RFI, RFJ and RFK vary according to the particular predecoder circuit 70 to which they are connected. According to one decoding scheme, seven row factor signal lines 97 make connection to the inputs of any one predecoder 70 while the remaining thirteen do not.

A precharge signal RDPC is connected to a gate 102 of a P-channel transistor 103 The current path of transistor 103 selectively connects a voltage supply source such as $V_{dd}$ to a node 104. The current path of another P-channel transistor 105 is also operable to connect $V_{dd}$ to the node 104.

The drain of an N-channel transistor 106 is connected to the node 104, while a source thereof is connected to the drain of a further N-channel transistor 107. The source of the N-channel transistor 107 is connected to a node 108, which in turn is connected to the drains of two N-channel transistors 109 and 110. The sources of N-channel transistors 109 and 110 are connected to ground or $V_{ss}$. The row factor signal line RFK is connected to the gate of transistor 107. The gate of transistor 109 is connected to signal line RFI, while the gate of transistor 110 is connected to signal line RFJ. The gate of transistor 106 is connected to the row redundancy enable signal line $\overline{RREN}$ (86).

Node 104 serves as the input to an inverter 111. The output of inverter 111 is connected to a node 112, which in turn is connected back to the gate of the P-channel transistor 105. Node 112 is also connected to second inputs of NAND gates 98–101.

The outputs of NAND gates 98–101 are connected to respective nodes 113, 114, 115 and 116. Each node 113–116 is connected to an input of a respective inverter 117–120. The output of each inverter 117–120 is connected to the source of a respective large pass gate transistor 121–124. Each of the pass gate transistors 121–124 has a gate thereof connected to $V_{dd}$.

The source of each pass gate transistor 121, 122, 123 and 124 is connected to the gate of a respective N-channel decoding transistor 125, 126, 127 or 128. The sources of each of the transistors 125–128 are connected to the drive/boot signal line 68 (RLXH). The drains of transistors 125–128 are connected to respective nodes 129, 130, 131 and 132. Each node 129–132 is connected to the source of a respective grounding transistor 133, 134, 135 or 136. The drains of the grounding transistors 133–136 are connected to ground or $V_{ss}$. The gates of each transistor 133–136 are connected by respective lines 137–140 back to respective nodes 113–116. Each node 129–132 is connected to a respective predecoder output line RDD0–RDD3.

Turning next to FIG. 7, a detailed schematic diagram of one decoder circuit 74 is illustrated. Decoder circuit 74 is enabled by high states of three row factor signals appearing on the respective gates of enabling transistors 142, 144 and 146 in the center of FIG. 7. The RF line 97 connected to the gate of transistor 142 is selected from one of lines RF4 through RF7. Similarly, the RF signal line connected to the gate of transistor 144 is selected from RF8 through RF11, and the row factor signal line 97 that is connected to the gate of transistor 146 is selected from RF12 through RF15. The selection as to which of these lines is connected to the particular decoder circuit 36 varies according to the identity of the particular decoder circuit 74 within the decoder section 92 (FIG. 5). In this way, one out of the sixty-four decoders 74 within any two decoder sections 92 (FIG. 5) can be selected.

A precharge signal line RDPC is connected to the gate of a P-channel transistor 148. The current path of transistor 148 is operable to connect a voltage supply $V_{dd}$ to a node 150. Node 150 is connected to the inputs of left and right inverters 152 and 154. The output of inverter 154 is connected to a node 156, which is in turn connected back to the gate of a P-channel transistor 158. The current path of transistor 158 connects a $V_{dd}$ voltage supply to node 150. Node 150 is connected through lines 160 and 162 to a node 164, and is further connected through lines 160 and 166 to a node 168. Node 150 is selectively connected through the current paths of selecting transistors 142, 144 and 146 to $V_{ss}$ or ground.

Right inverter output node 156 is connected to the sources of each of four pass transistors 170, 172, 174 and 176. The drains of transistors 170–176 are in turn respectively connected to lines 178, 180, 182 and 184. Lines 178–184 are connected to the gates of respective self-booting decoding transistors 186, 188, 190 and 192.

Node 164 is connected to the gate of each of four row line grounding transistors 194, 196, 198 and 200. Grounding transistors 194–200 are operable to connect respective word line nodes 202, 204, 206 and 208 to ground. Each row line node 202–208 is connected to a respective right array row line ROWL0R, ROWL1R, ROWL2R or ROWL3R.

The decoding circuitry for the left array is similar to that for the right array. An output node 210 of left inverter 152 is connected to the source of each of a plurality of pass gate transistors 212, 214, 216 and 218. The drain of each of the pass gate transistors 212–218 is connected to a gate of a respective self-booting decoding transistor 220, 222, 224 or 226. The current path of each decoding transistor 220–226 connects a respective predecoder output line RDD0–RDD3 to a respective left array row line node 228, 230, 232 or 234. The left array row lines ROWL0L, ROWL1L, ROWL2L and ROWL3L are connected to the respective left array row line nodes 228–234.

Referring next to FIG. 8, a detailed electric schematic diagram of a redundant decoder 72 is shown. A pair of control signals TLRC and RDPC operate the gates of respective P-channel transistors 250 and 252. Transistors 250 and 252 coact to connect a voltage supply source $V_{dd}$ to a trial node 254. Another pair of transistors 256 and 258 are operated by control signals KDPC and RFZ to precharge the signal node 254 through an alternate route. The node 254 is also connected to a plurality of fuses 260–286 that are each programmable to isolate respective addressing transistors 288–314 from the node 254. Fuses 260–286 can be replaced with any other suitable programmable or selectable isolation device such as a switch. Each current path of respective transistors 288–314 is operable to connect the node 254 to ground if its respective fuse is intact. The gates of addressing transistors 288–310 are actuated by high states on respective addressing lines RF0–RF11. The gates of addressing transistors 312 through 324 are actuated by high states on respective addressing lines RFI, RFJ, RFK, RFL, RFW, RFX and RFY. RFI–RFZ vary according to the placement of the particular redundant decoder 72 on the chip.

A second addressing transistor bank is indicated generally at 326. Bank 326 includes a trial node 328 that is precharged through either the combination of series-connected P-channel precharge transistors 330 and 332, or series-connected P-channel transistor 334 and an N-channel transistor 336. The node 328 is connected to the ends of a plurality of programmable fuses 338–364, which in turn are connected to the drains of respective N-channel addressing transistors 366–392. An additional five N-channel addressing transistors 394–402 are also connected to node 328, as transistors 316–324 connect to node 254 in the first bank 248.

The node 254 is connected to an inverter 404, which in turn has an output connected to a node 406. The node 406 is connected back to the gate of a P-channel transistor 408 whose current path connects $V_{dd}$ back to the node 254. The combination of the inverter 404 and the P-channel transistor 408 therefore coact to latch a low state at node 406.

The node 406 is also connected to the input of an inverter 410, whose output is connected to the current path of an N-channel pass transistor 412. The source of the pass transistor 412 is connected to a gate 414 of a self-booted redundant decoding transistor 416. The drain of transistor 416 is connected to the drive/boot signal line 68 (RLXH). The source of the decoding transistor 416 is connected to a node 418, in turn connected to a redundant row line RRWL0 (95).

Node 406 is also connected to the gate of an N-channel pull-down transistor 420, which has a current path operable to connect the redundant row line node 418 to ground.

Node 254 is also an input to a NOR gate 424. The other input of NOR gate 424 is the trial node 328 of the addressing transistor bank 326. The output of NOR gate 424 is the row redundancy line 86 ($\overline{\text{RREN}}$). The signal $\overline{\text{RREN}}$ is used as one input to a NAND gate 426, whose other input is a control signal RCC. The output of NAND gate 426 is input into a NAND gate 428. The second input of the NAND gate 428 is a control signal 432. The output 430 of NAND gate 428 is connected to a NAND gate in the next row redundancy decoder 72 that corresponds to NAND gate 426, thus effectively NANDING the $\overline{\text{RREN}}$ signals together to implement a design for test mode (DFT) known as row redundancy roll call.

In the second addressing transistor bank 326, the trial node 328 is connected as an input into an inverter 434. The inverter 434 has an output connected to a node 436, which in turn is connected to the gate of P-channel transistor 438. Node 436 is further connected to the input of an inverter 440, which has an output connected to the drain of an N-channel pass transistor 442. The source of the transistor 442 is connected to the gate 444 of a second self-booted redundant decoding transistor 446. The drain of transistor 446 is connected to the signal line RLXH (68), while its source is connected to a redundant row line node 448. A pulldown transistor 450 is operable to pull the redundant row line node 448 down to ground, which is operated by the state present at node 436.

Referring back to FIG. 6, the normal, that is, non-redundant, operation of the predecoder 70 is as follows. In its normal active-cycle state, the signal $\overline{\text{RREN}}$ is high at node 86. If the particular predecoder shown is selected through high states on a combination of RFK and one of RFI and RFJ, node 104 will be pulled to ground. A low state of node 104 is inverted to a high state at node 112, which in turn enables each of the NAND gates 98–101. This allows a high state on any one of the row factor signals RF0–RF3 to cause the output of a low state on one of the nodes 113–116.

Assume that RF1 has a high state on it, while RF0, RF2 and RF3 have low states. In this instance, the low state at node 114 is inverted by the inverter 118 and passed through the pass gate transistor 122 to appear as a high state on the gate of the predecoding transistor 126. This in turn connects the drive/boot signal line RLXH to the predecoder line RDD1. Since node 114 is low, the pulldown transistor 134 will be off. In the case of RDD0, RDD2 and RDD3, the states of nodes 113, 115 and 116 are high, and therefore the pulldown transistors 133, 135 and 136 are actuated to keep the other predecoder lines RDD0, RDD2 and RDD3 at ground.

Referring again to FIG. 7, and continuing the example that RDD1 is selected to go high, a particular decoder 74 is selected by having high states on each of the transistors 142, 144 and 146. This will cause a low state to appear on node 150, equivalent to a low state at nodes 164 and 168. The pulldown transistors 194, 196, 198, 200 and 240–246 will be disabled. Meanwhile, the low state at node 150 is inverted through inverters 152 and 154 to high states at nodes 156 and 210. These high states are passed through the pass gate transistors 170–176 and 212–218 to actuate transistors 186–200 and 220–226. Since in particular transistors 188 and 222 are turned on, a high state on RDD1 will be passed to row line ROWL1R and ROWL1L.

Suppose however that the row line consisting of ROWL1R and ROWL1L in a particular cell array is discovered to be defective. Referring to FIG. 8, fuse 262 will be blown by a programmer, as will three other fuses, such as fuse 272, 282 and 286, that depend on the set identity of the addressing signals RFn that in combination would normally address ROWL1R and ROWL1L. This example assumes that the address of ROWL1R as shown in FIG. 6 corresponds to high states on RF1, RF6, RF11 and RFJ. During the cycle, this particular combination of addressing signals will be sent into the array from the peripheral area 87 (FIG. 4) to connect to transistors 290, 300, 310 and 314, as well as NAND gate 99 (FIG. 6) and transistors 142, 144 and 146 (FIG. 7). However, the trial node 254 will not be drawn down to ground, as would have been the case for a nondefective row line, but will instead remain at near $V_{dd}$. This is because blown fuse 262, 272, 282 and 286 have isolated the current paths of all of the addressed transistors 290, 300, 310 and 314. The high state on node 254 is inverted to a low state 406 which in turn latches a high state at node 254 by the action of transistor 408. The low state at node 406 disables the pull-down transistor 420, and is also inverted through the inverter 410 and passed by the pass gate transistor 412 to actuate the gate 414 of the N-channel decoding transistor 416. This allows the drive/boot signal RLXH to be communicated to the redundant row line RRWL0 (95).

At the same time, a high state at node 254 is NORed by the gate 424 to output a low state on the $\overline{RREN}$ line 86. Returning now to FIG. 6, a low state on $\overline{RREN}$ disables the transistor 106, causing a high state to stay on node 104. The high state on node 104 is inverted to a low state on node 112, which disables each of the NAND gates 98–101. Therefore, the decoding transistor 126 will be disabled, and the RLXH signal will not be transmitted to the line RDD1, which in turn would be passed to the defective word line by the defective row decoder. Instead, this defective word line will be kept low by the actuation of the pull-down transistor 134 by a high state at node 114 and by its active row decoder. A low state at node 112 also disables the transistors 125, 127 and 128; but since the low state at 112 will not exist when these other lines are addressed, or even where other word lines which are to be driven high by RRD1 are addressed, only the defective row line consisting of ROWL1R and ROWL1L is deselected.

In summary, a novel redundant row line decoding scheme has been described and illustrated that disables a local predecoder. Fuses for every row line or row decoder are avoided, as are the inefficient replacement of good row lines with redundant row lines. Further, no separate drive/boot signal generator is required to implement redundancy.

While a preferred embodiment of the invention and its advantages have been described in the above detailed description, the invention is not limited thereto, but only by the spirit and scope of the appended claims.

What is claimed is:

1. A circuit for replacing a defective signal path with a redundant signal path, comprising:

a drive source;

a predecoder coupled to said drive source and to a plurality of predecoder lines, said predecoder lines coupling said predecoder to a plurality of decoders, each of said decoders connected to a respective plurality of word lines, said predecoder and plurality of decoders decoding selected ones of a plurality of addressing signals and selecting at least one of a plurality of signal paths from said drive source to one of said respective plurality of word lines; and a redundant decoder connected to a redundant word line and coupled to said predecoder for responding to addressing signals corresponding to a defective signal path, said redundant decoder generating a decoding-inhibiting signal to said predecoder to block said predecoder from selecting at least one of said plurality of signal paths and said redundant decoder selecting a redundant signal path for coupling said drive source to said redundant word line.

2. The circuit of claim 1, wherein said predecoder is operable to receive each of a set of said addressing signals corresponding in number to said predecoder lines, a selected state of one of said set normally operable to enable the establishment of a signal from said drive source to at least one predecoder line, said decoding-inhibiting signal operable to block the establishment of the signal path by said selected state.

3. The circuit of claim 1, wherein said redundancy decoder comprises a plurality of addressing transistors, each of said addressing transistors operable by a respective addressing signal to couple a node to a supply of a first voltage, circuitry for establishing a second voltage at said node prior to coupling to said node to said supply;

isolation devices for coupling respective ones of each said addressing transistors to said node, said redundant decoder programmable by selecting ones of said isolation devices to isolate respective transistors from said node such that addressing signals corresponding to said selected ones will be inoperable to couple said node to said supply of the first voltage;

circuitry coupled to said node for generating said decoding-inhibiting signal based on the presence of said second voltage at said node; and circuitry coupled to said node for establishing a signal path including said redundant signal path based on the presence of said second voltage at said node.

4. The circuit of claim 3, wherein said supply of said first voltage is ground.

5. The circuit of claim 3, wherein said isolation devices each comprise a fuse for coupling a current path of a respective addressing transistor to said node, said redundant decoder programmable by blowing selected ones of said fuses.

6. The circuit of claim 1, wherein said redundant decoder is programmable for responding to either of two different sets of said addressing signals that each correspond to a defective signal path, said redundant decoder operable to select one of up to two redundant signal paths in response thereto.

7. An array of integrated circuits, comprising:

an array area in which said integrated circuits are formed;

a plurality of decoding circuits formed in said array area each for decoding selected ones of a plurality of addressing signals and each operable to select at least one of a plurality of signal paths to respective integrated circuits in response thereto, said decoding circuit including a predecoder coupled to a drive source and a plurality of decoders coupled to said predecoder by a plurality of predecoder lines, said predecoder disabled from establishing a signal path from said drive source to said decoders in response to said predecoder receiving a disable signal;

for each decoding circuit, a redundant decoder formed in said array area and programmable for responding to predetermined ones of said addressing signals by generating said disable signal and by selecting a redundant signal path, at least one redundant integrated circuit coupled to said redundant signal path; and each said decoding circuit coupled to a respective redundant decoder for receiving said disable signal therefrom, said decoding circuit not decoding said predetermined ones of said addressing signals in response to receiving said disable signal, such that said drive source is routed to said redundant integrated circuit instead of an integrated circuit corresponding to said predetermined ones of said addressing signals.

8. A memory array, comprising:

a drive source;

a plurality of memory cell arrays arranged in rows and columns, each cell array having a plurality of row lines for accessing respective pluralities of memory cells;

for each cell array, at least one decoding circuit for decoding selected ones of a plurality of addressing signals and selecting at least one of a plurality of signal paths from said drive source to at least one of said row lines in response thereto;

for each decoding circuit, a predecoder coupled to said drive source and a plurality of decoders coupled to said predecoder by a plurality of predecoder lines, said predecoder disabled from establishing a signal path from said drive source to said decoders in response to said predecoder receiving a disable signal, a redundant decoder programmable for responding to addressing signals corresponding to a defective row line by both generating said disable signal and by coupling said drive source to a redundant row line; and said decoding circuit coupled to said redundant decoder for receiving said disable signal therefrom and disabled from decoding said addressing signals in response to receiving said disable signal.

9. The array of claim 8, wherein each said redundant decoder circuit is operable to enable the coupling of said drive source to one of up to two redundant row lines in the place of up to two defective row lines.

10. The array of claim 8, wherein said cell arrays, said decoding circuits and said redundant decoders are formed within an array area, said drive source formed exterior of said array area.

11. A method for replacing a defective signal path by a redundant signal path, comprising the steps of:

transmitting addressing signals to a redundant decoder and a signal path decoding circuit, said decoding circuit including a predecoder coupled to a drive source and a plurality of decoders coupled to said predecoder by a plurality of predecoder lines;

programming said redundant decoder to transmit a decoding-inhibiting signal to the predecoder in response to said redundant decoder receiving addressing signals corresponding to a defective signal path;

disabling the predecoder from establishing a signal path from said drive source to said plurality of decoders in response to said predecoder receiving the decoding-inhibiting signal; and selecting the redundant signal path in response to the redundant decoder receiving said addressing signals corresponding to said defective signal path.

12. The method of claim 11, and further comprising the steps of:

when no defective signal path exits, connecting a node to a supply of a first voltage by selected ones of a plurality of addressing transistors in response to said redundancy decoder receiving addressing signals corresponding to said selected ones of said addressing transistors;

when a defective signal path is discovered, programming the redundant decoder by programming a plurality of isolation devices each associated with a respective addressing signal to isolate a respective addressing transistor from the node;

receiving the addressing signals by the redundant decoder;

blocking by the programmed isolation devices the connection of the supply of the first voltage to the node through addressing transistors corresponding to respective programmed isolation devices; and generating the disable signal and enabling a drive source to be connected to the redundant signal path both in response to the state of said node being other than the first voltage.

13. The method of claim 12, wherein the isolation devices each comprise a fuse, said step of programming the isolation devices comprising blowing selected ones of said fuses.

14. The method of claim 12, wherein said step of connecting the node to the supply of the first voltage comprises the step of pulling the node to ground.

15. The method of claim 12, and further comprising the step of enabling the connection of one of a plurality of redundant signal paths to a drive source in replacement of one of a plurality of respective defective signal paths.

16. A method for replacing a defective row line in an array of memory cells arranged in rows and columns, each row of cells coupled to a respective row line, comprising the steps of:

programming a redundant decoder to respond to addressing signals that correspond to the defective row line;

receiving the addressing signals by the redundant decoder and a signal path decoding circuit coupled to the row lines;

transmitting a disable signal from the redundant decoder to the decoding circuit in response to receiving the addressing signals corresponding to the defective row line, said decoding circuit including a predecoder coupled to a drive source and a plurality of decoders coupled to predecoder lines;

disabling the predecoder from establishing a signal path from said drive source to said decoders in response to said predecoder receiving the disable signal; and selecting a redundant row line in response to the redundant decoder receiving the addressing signals corresponding to the defective row line.

17. The method of claim 16, and further comprising the steps of:

organizing the memory cells into a plurality of arrays on a face of an integrated circuit chip to be disposed in rows and columns;

for each cell array, disposing a decoding circuit and a redundant decoder in proximity thereto;

forming a single drive source generator in a peripheral area of the chip outside of said plurality of arrays; and coupling the drive source generator to each of the redundant decoders and each of the decoding circuits in said plurality of arrays.

* * * * *

REEXAMINATION CERTIFICATE (3867th)

United States Patent [19]
Kersh, III et al.

[11] B1 5,475,640
[45] Certificate Issued *Sep. 7, 1999

[54] METHOD AND APPARATUS FOR INHIBITING A PREDECODER WHEN SELECTING A REDUNDANT ROW LINE

[75] Inventors: David V. Kersh, III, Houston; Roger D. Norwood, Sugarland, both of Tex.

[73] Assignee: Texas Instruments, Inc., Dallas, Tex.

Reexamination Request:
No. 90/004,255, May 28, 1996

Reexamination Certificate for:
Patent No.: 5,475,640
Issued: Dec. 12, 1995
Appl. No.: 08/215,554
Filed: Mar. 21, 1994

[*] Notice: This patent is subject to a terminal disclaimer.

Related U.S. Application Data

[63] Continuation of application No. 07/653,855, Feb. 8, 1991, Pat. No. 5,327,380, which is a continuation of application No. 07/265,105, Oct. 31, 1988, abandoned.

[51] Int. Cl.⁶ ................................................ G11C 8/00
[52] U.S. Cl. .................... 365/200; 365/189.05; 365/195; 365/230.03; 365/230.06; 371/10.3
[58] Field of Search ................ 365/230.06, 230.03, 365/195, 200, 189.05, 189.09

[56] References Cited

U.S. PATENT DOCUMENTS

| | | | |
|---|---|---|---|
| 4,365,319 | 12/1982 | Takemae | 365/200 |
| 4,517,639 | 5/1985 | Ferrell et al. | 364/186 |
| 4,546,455 | 10/1985 | Iwahashi et al. | 365/200 |
| 4,627,276 | 12/1986 | Burgess et al. | 73/152.44 |
| 4,635,233 | 1/1987 | Matsumoto et al. | 365/230 |
| 4,731,761 | 3/1988 | Kobayashi | 365/230 |
| 4,758,993 | 7/1988 | Takemae | 365/222 |
| 5,105,353 | 4/1992 | Charles et al. | 395/709 |
| 5,191,555 | 3/1993 | Tabacco et al. | 365/230.08 |
| 5,208,776 | 5/1993 | Nasu et al. | 365/200 |
| 5,220,534 | 6/1993 | Loh et al. | 365/189.09 |
| 5,278,802 | 1/1994 | Kersh et al. | 365/230.06 |
| 5,297,086 | 3/1994 | Nasu et al. | 365/200 |
| 5,309,446 | 5/1994 | Cline et al. | 365/201 |
| 5,327,380 | 7/1994 | Kersh et al. | 365/200 |
| 5,345,422 | 9/1994 | Redwine et al. | 365/189.09 |
| 5,422,850 | 6/1995 | Sukegawa et al. | 365/200 |
| 5,471,613 | 11/1995 | Banning et al. | 395/600 |
| 5,475,640 | 12/1995 | Kersh et al. | 365/200 |
| 5,487,040 | 1/1996 | Sukegawa et al. | 365/200 |
| 5,526,276 | 6/1996 | Cox et al. | 364/489 |
| 5,550,394 | 8/1996 | Sukegawa et al. | 365/200 |

FOREIGN PATENT DOCUMENTS

| | | |
|---|---|---|
| 0 029 322 | 5/1981 | European Pat. Off. . |
| 29322 | 5/1981 | European Pat. Off. . |
| 62-264496 | 11/1987 | Japan . |

OTHER PUBLICATIONS

R. Beam, "A Dict. of Electronic Terms," Ninth Edit., 3ʳᵈ Pr., Feb. 1970, ©Allied Radio, L.C. 68–20283, p. 71.

H. Gray et al., "A New Dict. of Physics," ©1975 Longman Group Ltd., London, R 530.03GR, p. 415.

(List continued on next page.)

*Primary Examiner*—A. Zarabian

[57] ABSTRACT

A circuit is provided for replacing a defective signal path (94) of a plurality of like signals paths with a redundant signal path (95, 96). A redundant decoder (72) is programmable to respond to a plurality of predetermined addressing signals (RFn) that normally operate to address the defective signal path (94, ROWL1R and ROWL1L). The redundant decoder is operable to generate a disable signal (RREN) in response to the predetermined addressing signals (RFn) and also is operable to select a redundant signal path (95, 96) in response thereto. A decoding circuit (70, 74) normally decodes selected ones of a plurality of addressing signals (RFn) and selects at least one of a plurality of signal paths in response thereto. The decoding circuit (70, 74) is coupled to the redundant decoder (72) for receiving the disable signal (RREN) therefrom. In response to receiving this disable signal (RREN) the decoding circuit (70, 74) will not decode the preselected addressing signals (RFn).

OTHER PUBLICATIONS

F. Say et al., "IEEE Std. Dict. of El. & Electr. Terms," $3^{rd}$ Edit, 1984, p. 668.

Pat. 5,191,555: Fig. 9 (Sheet 49); Pat. 5,208,776: Fig. 9 (Sheet 49); Pat. 5,220,534; Fig. 9 (Sheet 49); Pat. 5,297,086: Fig. 9 (Sheet 49); Pat. 5,309,446; Fig. 9 (Sheet 49) and Appendix (Col. 5185,186); Pat. 5,345,422; Fig. 9 (Sheet 49) and Col. 5 37,38; Pat. 5,550,394; Fig. 25 (Sheet 15).

Mosaid, inc., *An Analysis of hte Toshiba TC511000/ TC511001 CMOS 1Mx1 DRAMs*, Aug. 1986.

Christopher J. Booth, Editor The New IEEE Standard Dictionary of Electrical and Electronics Terms, 1993, pp. 37, 38, and 123.

Editor, Donald G. Fink, *Electronics Engineers' Handbook*, Second Edition, McGraw Hill Book Company, Copyright 1982, Pulsed Circuits, Logic Circuits, and Waveform Generators 16–48.

U.S. Court of Appeals Federal Court, In re Alton, No. 94-1495, Decided Feb. 5, 1996, 1. Practice and Procedure in Patent and Trademark Office—Prosecution—Declaration/ Affidavits (§110.0913), Patentability/Validity—Specification—Written description (§115.1103), pp. 1578–1585.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 6, lines 1–13:

Turning now to FIG. 6, there is illustrated a detailed electrical schematic diagram of one of the predecoders 70. *The predecoder 70 includes a common decoder circuit, having an output node 112, for enabling all four drive circuits that produce respective output signals RDD0–RDD3.* A plurality of selected row factor lines 97 are connected as inputs to the predecoder circuit 70. Row factor lines RF0–RF3 are connected to respective inputs of four NAND gates 98-101. Row factor signal lines RF0–RF3 are connected to each predecoder circuit 70 on the chip. On the other hand, the identity of three other row factor signal input lines RFI, RFJ and RFK vary according to the particular predecoder circuit 70 to which they are connected. According to one decoding scheme, seven row factor signal lines 97 make connection to the inputs of any one predecoder 70 while the remaining thirteen do not.

Column 8, lines 55–65:

Referring back to FIG. 6, the normal, that is, non-redundant, operation of the local predecoder 70 is as follows. In its normal active-cycle state, the signal $\overline{\text{RREN}}$ is high at node 86. If the particular local predecoder shown is selected through high states on a combination of RFK and one of RFI and RFJ, node 104 will be pulled to ground. A low state of node 104 is inverted to a high state at *common decoder output* node 112, which in turn enables each of the NAND gates 98–101. This allows a high state on any one of the row factor signals RF0–RF3 to cause the output of a low state on one of the nodes 113–116.

AS A RESULT OF REEXAMINATION, IT HAS BEEN DETERMINED THAT:

Claims 1–17 are cancelled.

\* \* \* \* \*